United States Patent [19]
LeMoncheck et al.

[11] Patent Number: 5,629,891
[45] Date of Patent: May 13, 1997

[54] WRITABLE ANALOG REFERENCE VOLTAGE STORAGE DEVICE

[75] Inventors: John LeMoncheck, El Granada; Timothy P. Allen, Los Gatos; Günter Steinbach, Palo Alto; Carver A. Mead, Pasadena, all of Calif.

[73] Assignee: Synaptics, Incorporated, San Jose, Calif.

[21] Appl. No.: 622,763

[22] Filed: Mar. 25, 1996

Related U.S. Application Data

[63] Continuation of Ser. No. 267,595, Jun. 27, 1994, Pat. No. 5,541,878, which is a continuation-in-part of Ser. No. 112,393, Aug. 26, 1993, abandoned, which is a continuation of Ser. No. 961,785, Oct. 15, 1992, Pat. No. 5,243,554, which is a continuation of Ser. No. 697,410, May 9, 1991, Pat. No. 5,166,562.

[51] Int. Cl.$^6$ ............................................. B11C 16/04
[52] U.S. Cl. .............................. 365/185.03; 365/185.21; 365/185.27
[58] Field of Search ................... 365/185.03, 185.21, 365/185.27

[56] References Cited

U.S. PATENT DOCUMENTS

| | | | |
|---|---|---|---|
| 4,276,615 | 6/1981 | Kuhnel | 365/45 |
| 4,725,984 | 2/1988 | Ip et al. | 365/189 |
| 4,953,928 | 9/1990 | Anderson et al. | 357/23.5 |
| 4,999,812 | 3/1991 | Amin | 365/185 |
| 5,021,999 | 6/1991 | Kohda et al. | 365/168 |
| 5,028,810 | 7/1991 | Castro et al. | 307/201 |
| 5,033,023 | 7/1991 | Hsia et al. | 365/185 |
| 5,119,330 | 6/1992 | Tanagawa | 365/185.03 |
| 5,241,494 | 8/1993 | Blyth et al. | 365/185.03 |
| 5,262,984 | 11/1993 | Noguchi et al. | 365/185.03 |

Primary Examiner—Joseph E. Clawson, Jr.
Attorney, Agent, or Firm—D'Alessandro & Ritchie

[57] ABSTRACT

A circuit for generating N analog voltage signals for reference or bias use employs N analog floating gate storage devices. Circuitry is provided so that all floating gate storage devices can be programmed to their target voltages individually or in parallel. Electron injection circuitry is provided for injecting electrons on to and a tunneling structure is provided for removing electrons from the floating gate of each floating gate storage device. A transistor structure with a lightly doped drain is provided for control of the tunneling structure. A capacitor is connected to each floating gate node to provide control of the injection structure. A dynamic analog storage element is provided to store the target voltage for the floating gate storage device. A comparator is provided to monitor the floating gate voltage and target voltage and control tunneling and injection. A digital storage device is provided to statically store the output of the comparator. During normal operation of the voltage reference circuit, the voltage comparator is configured as a follower amplifier to buffer the analog voltage output. During normal operation of the bias reference circuit, the current comparator is configured as a current mirror to buffer the analog current output.

16 Claims, 6 Drawing Sheets

WRITABLE ANALOG REFERENCE VOLTAGE STORAGE DEVICE

RELATED APPLICATIONS

This application is a continuation of patent application Ser. No. 08/267,595, filed Jun. 27, 1994, now U.S. Pat. No. 5,541,878, which is a continuation-in-part of application Ser. No. 08/112,393, filed Aug. 26, 1993, abandoned which is a continuation of application Ser. No. 07/961,785, filed Oct. 15, 1992, now U.S. Pat. No. 5,243,554, which is a continuation of application Ser. No. 07/697,410, filed May 9, 1991, U.S. Pat. No. 5,166,562.

BACKGROUND OF THE INVENTION

1. Field of the Invention

The present invention relates to integrated circuit technology. More particularly, the present invention relates to a writable analog reference storage device circuit for inclusion on an integrated circuit.

2. The Prior Art

Integrated circuit pin count translates directly into cost per packaged integrated circuit in terms of packaging and circuit board space. There is thus a need to maintain low pin counts on production integrated circuits. Because of the competing consideration to maximize functionality of the integrated circuit, maintaining a low pin count presents a challenge to the integrated circuit designer.

For example, a particular challenge exists in designing analog and mixed analog-digital integrated circuits which require analog voltage references and bias signals. In the prior art, use has been made of dynamic circuits for storing and periodically refreshing analog voltages in an on-chip circuit, such as a sample/hold circuit. However, this approach requires off-chip memory and digital-to-analog converter circuits, or the like. In addition, the dynamic refresh cycle clocking needed for such circuits generates additional on-chip noise which must be dealt with if dynamic refresh schemes are contemplated. An alternative solution which may be employed to provide on-chip voltage references and bias voltages utilizes on-chip EEPROMs and digital-to-analog converters. This solution, however, requires allocation of valuable chip area to accommodate the additional circuitry.

There is thus a need for circuitry which can provide on-chip analog reference and bias voltages without requiring use of an unacceptably large number of chip I/O pins or requiring significant additional on-chip or off-chip circuitry.

BRIEF DESCRIPTION OF THE INVENTION

According to a first aspect of the present invention, an analog reference voltage generating circuit for generating an analog voltage signal for reference use employs an analog floating gate storage device. A plurality of such circuits may be disposed on a single integrated circuit die. Circuitry is provided for injecting electrons on to and removing electrons from the floating gate of each analog floating gate storage device in each analog reference voltage generating circuit. A dynamic analog storage device is used to store the target voltage for each analog reference voltage generating circuit, and an amplifier is configured as a comparator to compare the target voltage and the floating gate voltage to determine whether electrons need to be added to or removed from the floating gate storage device. A control structure is provided for each floating gate storage device which responds to the output of the comparator and controls the electron injection and tunneling circuits to alter the floating gate voltage to reach the target voltage. After programming to the desired target voltage is complete, the amplifier is configured as a source follower amplifier to buffer the output of the floating gate storage device and provide the desired output voltage.

Dynamically configuring the same amplifier as both a comparator and a source follower amplifier has the advantage that the same random offsets inherent in the comparator which effect programming will be inherent in the operation of the source follower and will not introduce an offset in the final output voltage. Because each floating gate storage device has its own target dynamically stored, programming of a bank of analog floating gate devices can occur simultaneously.

According to a second aspect of the present invention, a bias current generating circuit for generating P-channel or N-channel MOS transistor bias signals employs an analog floating gate storage device. A plurality of such circuits may be disposed on a single integrated circuit die. Circuitry is provided for injecting electrons on to and removing electrons from each floating gate storage device. A dynamic analog storage device is used to store the target current for each bias current generating circuit, and a comparison between the target current and the current generated by the floating gate voltage is made which determines whether electrons need to be added to or removed from the floating gate storage device. A control structure is provided for each floating gate storage device which responds to the output of the comparator and controls the electron injection and tunneling circuits to alter the floating gate voltage until the current generated by the floating gate voltage reaches the target current. Each floating gate storage device has a voltage representing its own target current dynamically stored, so programming a bank of devices can occur simultaneously.

A state register block is provided for controlling a plurality of either the analog reference voltage generating circuits or the bias current generating circuits of the present invention, and comprises digital selection circuitry which can be implemented in several different ways, each having a different I/O pin count requirement. For a direct addressing selection scheme, the pin requirement is proportional to $\log_2(N)$, where N is the number of storage devices. For a shift register selection scheme, the pin requirement is independent of the number of storage devices. There are modes of operation where it is useful to have simultaneous selection of circuits. It is therefore preferable to use a digital selection scheme which allows one or more circuits to be simultaneously selected.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

U.S. Pat. Nos. 4,953,928, 5,059,920, and 5,166,562 are expressly incorporated herein by reference.

A circuit for providing on-chip analog reference and bias voltages according to the present invention is built around one or more analog floating gate devices including means for placing electrons onto and removing electrons from the floating gate. Numerous floating gate structures having this ability are disclosed in U.S. Pat. No. 5,059,920. An example of such a floating gate device is shown schematically in FIG. 1a. The floating gate device of FIG. 1a is also shown in top view and in cross sectional view, respectively, in FIGS. 1b and 1c–1d.

Figure 1A:
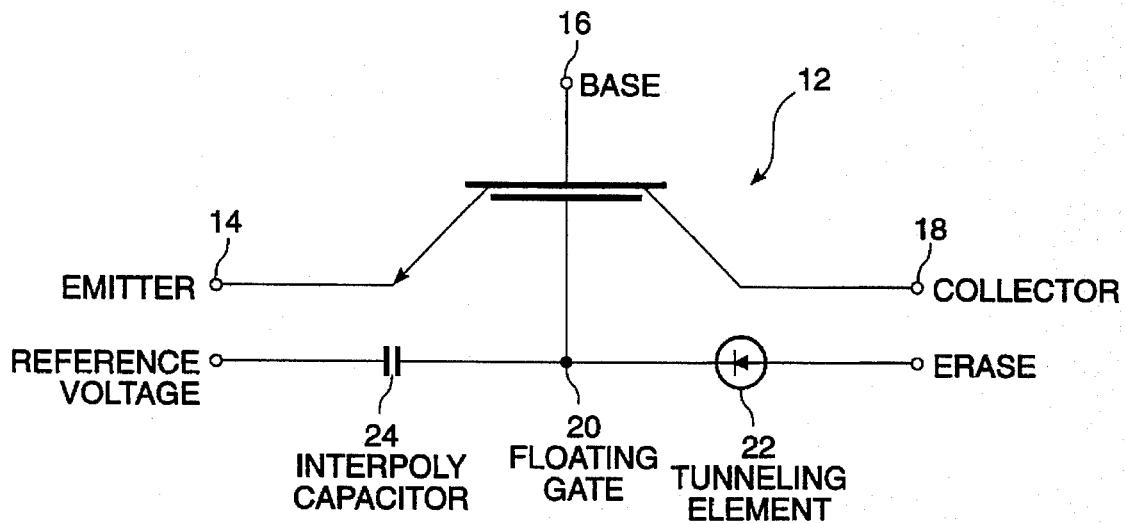
FIG. 1a is a schematic diagram of an illustrative analog floating gate device used in a presently preferred embodiment of the invention.

Referring first to FIG. 1a, an analog floating gate device 10 includes a hot-electron injection device 12, symbolically represented as a bipolar transistor including an emitter 14, base 16, and collector 18. As shown in FIG. 1a, floating gate 20 is associated with hot electron injection device 12. Analog floating gate device 10 also includes a tunneling element 22 connected between a tunnel circuit node and floating gate 20, and a capacitor 24 connected between floating gate 20 and a reference voltage.

Figure 1B:
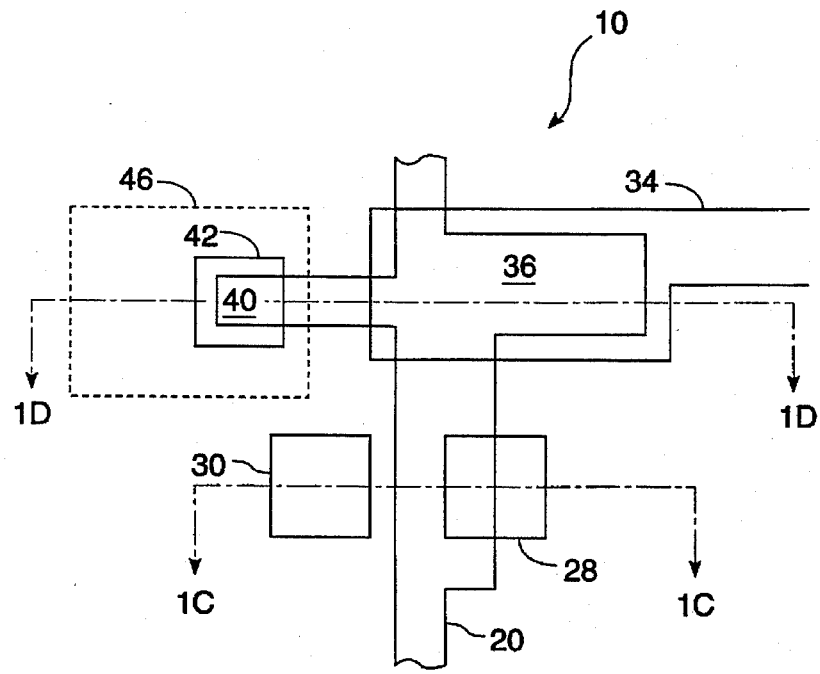
FIG. 1b is a top view of the circuit of FIG. 1a realized in silicon.
Figure 1C:
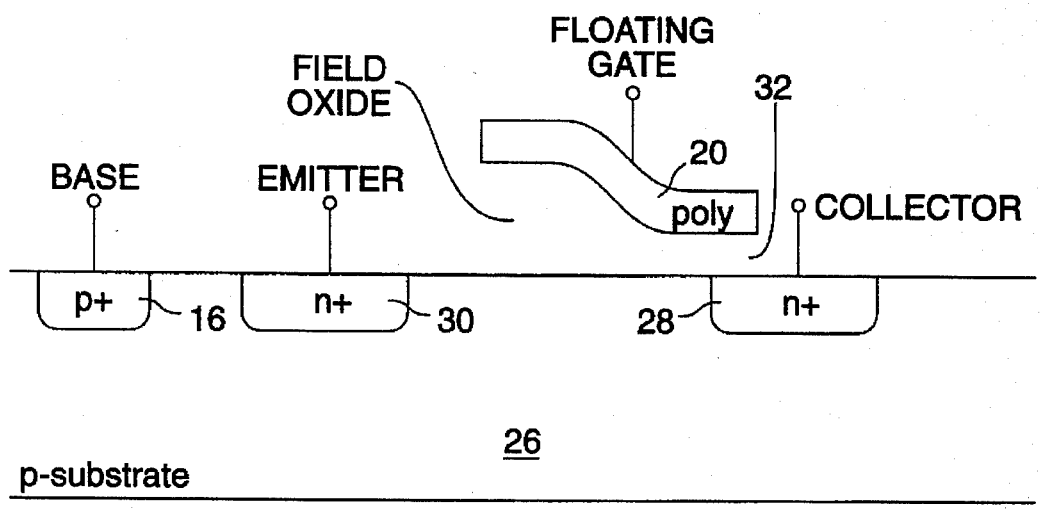
FIGS. 1c and 1d are cross sectional views of the circuit structure shown in FIG. 1b taken through lines 1c—1c and 1d—1d, respectively.
Figure 1D:
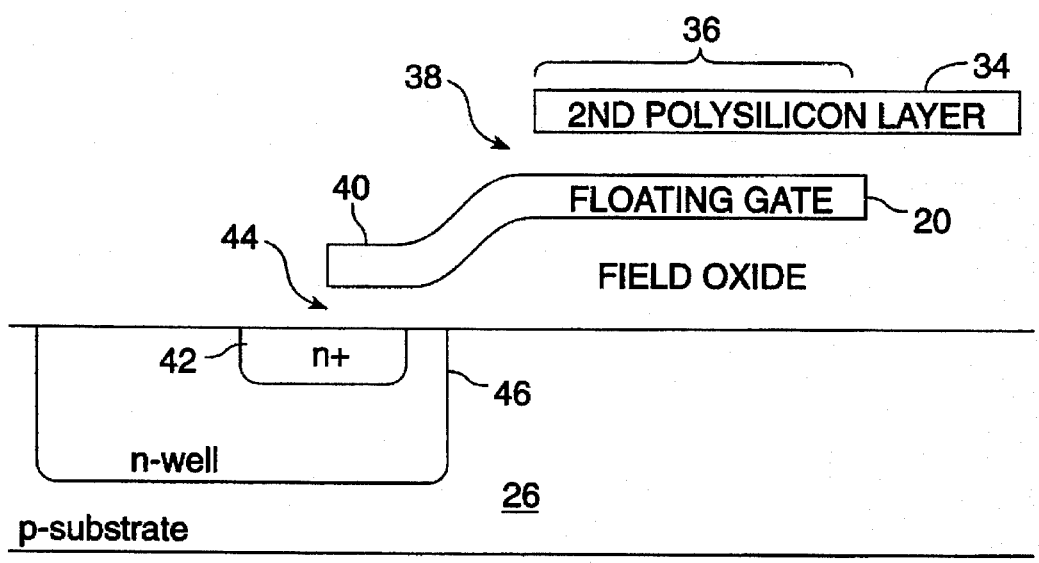

As is disclosed in U.S. Pat. No. 4,953,928, and as is shown in FIGS. 1b, 1c, and 1d, analog floating gate device 10 is formed in a p-type semiconductor substrate 26. First and second spaced-apart n-type regions 28 and 30 are disposed in substrate 26. A polysilicon floating gate 20 is separated from the surface of substrate 26 by a layer of insulating material 32, such as a gate oxide. One edge of polysilicon floating gate 20 is aligned with the edge of the first n-type region 28 such that polysilicon floating gate 20 does not lie appreciably over first n-type region 28. Since the border of first n-type region 28 defines the field edge, the portion of floating gate 20 lying over first n-type region 28 will be separated from the surface of substrate 26 by a layer of gate oxide 32, while the remainder of floating gate 20 will be separated from the surface of substrate 26 by a thicker layer of field oxide. Second n-type region 30 lies beyond the opposite edge of the polysilicon floating gate 20. The first n-type region 28, the p-type substrate 26, and the second n-type region 30 form the collector, base, and emitter, respectively, of the lateral bipolar transistor hot-electron injection device 12 of FIG. 1a.

As may be most easily seen from an examination of FIGS. 1b and 1d, a second polysilicon layer 32 includes a portion 34 which overlies a large portion of floating gate 20. Portion 34 of the second polysilicon layer is separated from floating gate 20 by a layer of interpoly oxide 36 as is known in the art and is thus capacitively coupled to floating gate 20. Portion 34 of the second polysilicon layer is used to hold floating gate 20 at a desired potential by capacitive coupling.

As is disclosed in U.S. Pat. No. 4,953,928, and as may be most easily seen from an examination of FIGS. 1b and 1d, a small portion 38 of floating gate 20 overlies a region of n-type material 40 separated by a layer of insulating material 42, such as gate oxide. The region of n-type material 40 lies in an n-well 44 and together they form the on node of a tunneling device 22. When the n-well 44 is biased to a high positive voltage (typically 25 V positive with respect to floating gate 20 for a 225 Angstrom gate oxide thickness) electron tunneling from floating gate 20 is elicited via tunneling device 22, thereby charging floating gate 20 to a more positive potential.

As will be appreciated by those of ordinary skill in the art, an analogous structure may be formed using a p-well in an n-type semiconductor substrate containing a single n-type region in which the substrate, the well, and the n-type region, respectively, form the emitter, base, and collector of a bipolar transistor. In such an embodiment, one edge of the floating gate is aligned with the edge of the n-type region such that the floating gate does not lie appreciably over the n-type region. Such skilled persons will also recognize that the hot-electron injection devices described herein and in U.S. Pat. Nos. 4,953,928 and 5,059,920, including the prior art split-gate device described in U.S. Pat. No. 4,953,928, do not employ avalanche breakdown mechanisms as part of their injection physics and are therefore known in the art as non-avalanche hot-electron injection devices. The details and operation of both embodiments will be understood by those of ordinary skill in the art from the description herein and are set forth in detail in U.S. Pat. No. 4,953,928.

Figure 2:
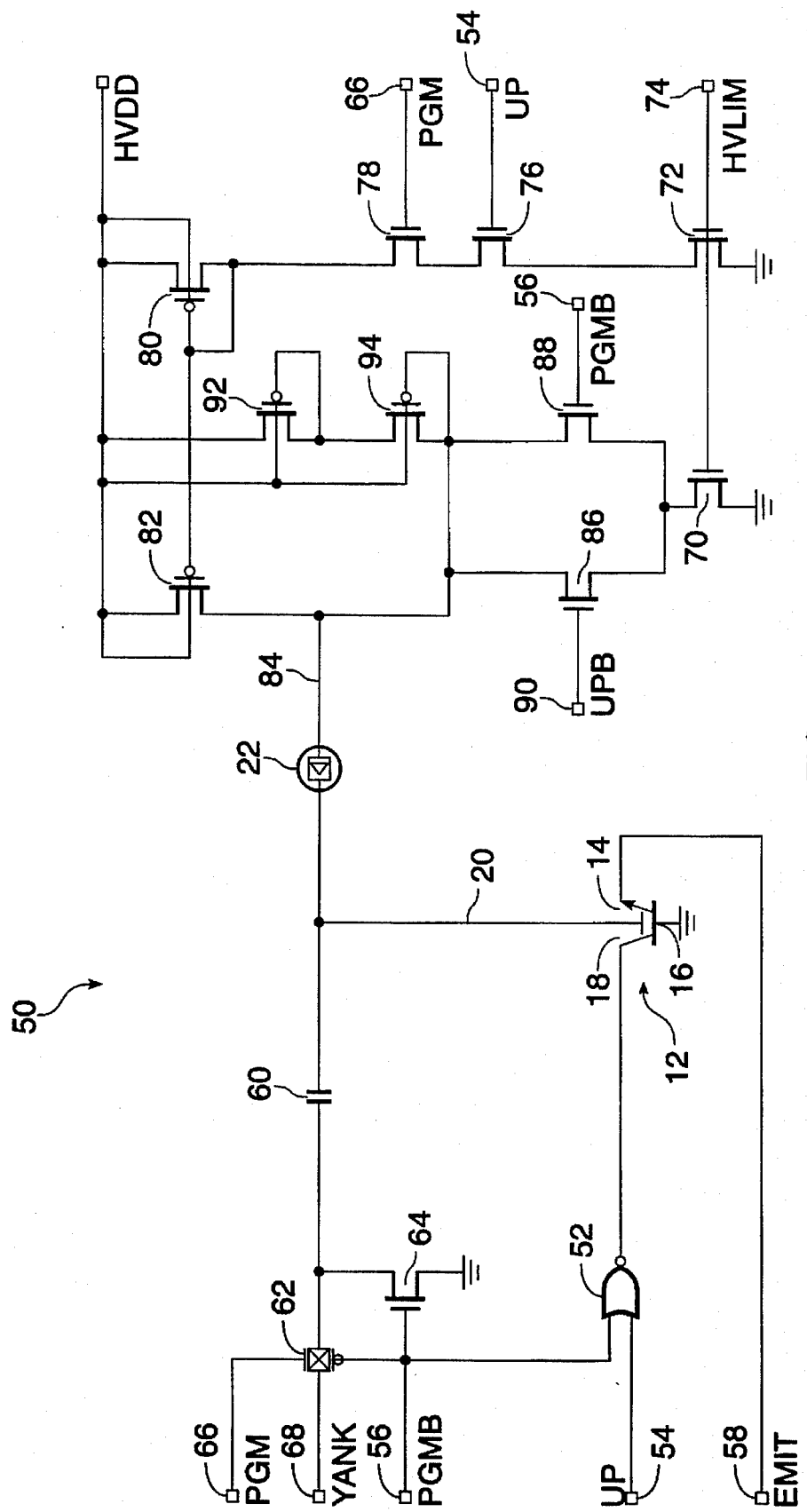
FIG. 2 is a schematic diagram of a circuit for providing an analog voltage on an integrated circuit chip according to the present invention.

Referring now to FIG. 2, an injection and tunneling control circuit 50 for controlling hot electron injection and tunneling based on typical digital logic levels encountered in integrated circuits is described. Throughout this disclosure, positive logic nomenclature is employed, i.e., if a logic level is "true" it is a logic 1 or high logic level ($\approx$5 volts assuming VDD is 5 volts), and if a logic signal is "false", it is a logic 0 or low logic level ($\approx$0 volts).

Each injection and tunneling control circuit 50 contains a hot electron device 12 and a tunneling device 22 such as the ones shown in FIG. 1a, associated with floating gate 20. A NOR gate 52 drives the collector 18 of hot electron injection device 12. One input of the NOR gate is driven from a control node UP (reference numeral 54) and the other input is driven from a complementary program control node 56 (PGMB). The emitter 14 of hot electron injection device 12 is connected to an emitter node 58 (EMIT). The base 16 of hot electron injection device 12 is connected to a fixed voltage node shown as ground in FIG. 2.

A capacitor 60 preferably having a magnitude of about 0.5 pf or greater is associated with the floating gate 20 of the analog floating gate device 10. A first electrode of the capacitor is formed from a portion of the floating gate 20 and the second electrode of capacitor 60 is connected to a conventional CMOS pass gate 62 and to the drain of an N-channel MOS pulldown transistor 64. The source of N-channel MOS pulldown transistor 64 is connected to ground. The gate of N-channel MOS pulldown transistor 64 and negative input of pass gate 62 are connected to the PGMB node 56. The positive control input of pass gate 62 is connected to a program control node 66 (PGM). The pass gate 62 and N-channel MOS pulldown transistor 64 create a structure such that the second electrode of capacitor 60 can either be held at ground or connected to the signal appearing on circuit control node YANK (reference numeral 68). The YANK node is used to capacitively couple the floating node 20 to a voltage significantly greater than ground. The floating node 20 must be coupled up to about 4 volts so that the hot electron device 12 can inject carriers into the floating node 20.

The tunneling device 22 of the analog floating gate device 10 is controlled by a high voltage structure which comprises two N-channel MOS transistors 70 and 72, both having their sources connected to ground. N-channel MOS transistors 70 and 72 create a bias current controlled by circuit control node HVLIM (reference numeral 74) to which their gates are both connected. The drain of N-channel MOS transistor 72 is connected to a series combination of N-channel MOS transistors 76 and 78. The gate of N-channel MOS transistor 76 is connected to circuit control node UP (reference numeral 54), and the gate of N-channel MOS transistor 78 is connected to the PGM control node 66. N-channel MOS transistors 76 and 78 create a simple current mode AND gate, such that the bias current generated by N-channel MOS transistor 72 will flow through them only when both the PGM and UP signals at nodes 66 and 54 are true.

The drain of N-channel MOS transistor 78 is connected to a diode connected P-channel MOS transistor 80. The drain of N-channel MOS transistor 78 is lightly doped to withstand the large voltage drop between drain and source that will occur during normal operation as is understood by those skilled in the art. The source and bulk of diode connected P-channel MOS transistor 80 are both connected to high voltage supply node (HVDD).

P-channel MOS transistor 82 also has its source and bulk tied to high voltage supply node HVDD and forms a current mirror with diode-connected P-channel MOS transistor 80. The drain of transistor P-channel MOS transistor 82 is connected to the tunneling electrode 84 of the tunnel device 22. The tunneling electrode 84 of the tunnel device 22 is also connected to the drains of two N-channel MOS transistors 86 and 88 which have their sources connected together to the drain of N-channel MOS transistor 72. N-channel MOS transistors 86 and 88 have lightly doped drains to enable them to withstand the large voltage drop between drain and source that will occur during normal operation as is understood by those skilled in the art. The gate of N-channel MOS transistor 86 is connected to circuit control node UPB (reference numeral 90), and the gate of N-channel MOS transistor 88 is connected to circuit control node PGMB (reference numeral 56). N-channel MOS transistors 86 and 88 form a simple current mode OR gate, such that the bias current generated by N-channel MOS transistor 72 will flow through either of them when either control signal UPB or PGMB is true.

Finally, P-channel diode-connected MOS transistors 90 and 92 are connected in series between the high voltage supply HVDD and the common drain connections of N-channel MOS transistors 86 and 88. The bulks of both P-channel diode-connected MOS transistors 90 and 92 are connected to the high voltage supply HVDD.

Those of ordinary skill in the art will appreciate the operation of the injection and tunneling control circuit 50 of FIG. 2 from the following description. First, it is instructive to establish certain of the voltage and current parameters which enable operation of the circuit. Those of ordinary skill in the art will recognize that, while the parameters disclosed here are preferred, certain variations may be made without materially affecting circuit operation.

To write a voltage onto floating gate 20, the emitter 14 of the hot electron injection device should be biased below ground (e.g., at about −0.6 V) such that the emitter current through the lateral bipolar hot electron injection device 12 is about 2 μA. The high voltage power supply node HVDD should be set to about 30 V to provide sufficient voltage to drive the gate oxide tunneling device as described in U.S. Pat. No. 4,953,928. VDD should be set to about 5 V to provide sufficient voltage to enable hot electron injection onto the floating gate device. The node HVLIM should be set to a voltage of about 1 volt in order to bias N-channel transistors 70 and 72 to provide a current to the control circuitry embodied by transistors 76, 78, 86, and 88 as discussed above. A more complete discussion of the operation of the tunneling and hot electron injection devices is known and may be found, for example, in U.S. Pat. Nos. 4,953,928, 5,059,920, and 5,166,562.

In the embodiment of FIG. 2, the control signal pairs UP and UPB and PGM and PGMB are assumed always to be complementary logic signals. To increase the voltage on floating gate 20, electrons must be tunneled off the floating gate. To accomplish the tunneling, the signals PGM and UP are true, thus turning on N-channel MOS transistors 76 and 78 so that the bias current set by N-channel MOS transistor 72 with the voltage at node HVLIM on its gate will flow through transistors 76, 78, and 80. Because of the mirror configuration of P-channel MOS transistors 80 and 82, the bias current will also flow through P-channel MOS transistor 82.

Since both control signals PGMB and UPB are false when their complements PGM and UP are true, there is 0 v on the gates of N-channel MOS transistors 86 and 88, which are thus turned off. Since the current through P-channel MOS transistor 82 has no direct path to ground, the voltage on tunneling electrode 84 will rise up to the high voltage supply value at HVDD. HVDD should be set to about 30 V so that there is sufficient voltage to tunnel the floating gate device.

When either or both of control signals PGM or UP is false, then either N-channel MOS transistor 76 or 78 will be turned off and no current will flow through P-channel MOS transistor 80 and its mirror transistor 82. When either PGM or UP is false, then one of their complements (PGMB or UPB) must be true. When either PGMB or UPB is true, there will be 5 v on the gate of one of N-channel MOS transistors 86 or 88. Thus, current from the diode-connected transistors 90 and 92 can flow to ground, and the tunneling electrode 84 will be several volts below the voltage HVDD of the high voltage supply.

The exact voltage that is on tunneling electrode 84 in this state will be determined by the bias current set by the voltage on node HVLIM and by the sizes of P-channel diode-connected MOS transistors 90 and 92, but it should be sufficiently low such that there is negligible tunneling through the tunnel device 22. However, the voltage difference between the tunneling electrode 84 in this state and HVDD must not be larger than the breakdown voltage of the P-channel MOS transistor 82.

To decrease the voltage on floating gate 20, electrons must be injected on to the floating gate. For electron injection to occur, neither UP nor PGMB must be true. If either UP or PGMB is true, then the output of the NOR gate 52 is false and hence the voltage on the collector 18 of hot electron injection device 12 will be 0 v, below that necessary for a favorable injection condition. In addition, the voltage at the second plate of capacitor 60 must be increased from some quiescent level (typically ground potential) to a new level (typically 5 v above ground potential). Thus, the floating gate 20 will be capacitively coupled to a higher voltage and create a gate voltage on hot electron injection device 12 necessary for a favorable injection condition. To change the voltage on the second plate of capacitor 60, pass gate 62 must be turned on by setting PGM node 66 true, thus setting false its complementary signal at PGMB node 56. The voltage on YANK node 68 will then appear on the second plate of capacitor 60.

Those skilled in the art will appreciate that the conditions for injection (UP false, PGM true) and tunneling (UP true, PGM true) are mutually exclusive, thus assuring that injection and tunneling can never occur simultaneously. Also, those of ordinary skill in the art will recognize that PGM is an independent control that can prevent both processes from occurring, stopping any further changes to the floating gate voltage. When PGM is false and PGMB is true, the pass gate 62 is off and the N-channel MOS pulldown transistor 64 is turned on, thus holding the second plate of capacitor 60 at ground.

According to one aspect of the present invention, circuit including a number of injection and tunneling control circuits 50 may be disposed on a single integrated circuit for supplying a plurality of analog reference voltages in cooperation with a like number of reference voltage generating circuits. An example of such a circuit is shown in FIG. 3.

Figure 3:
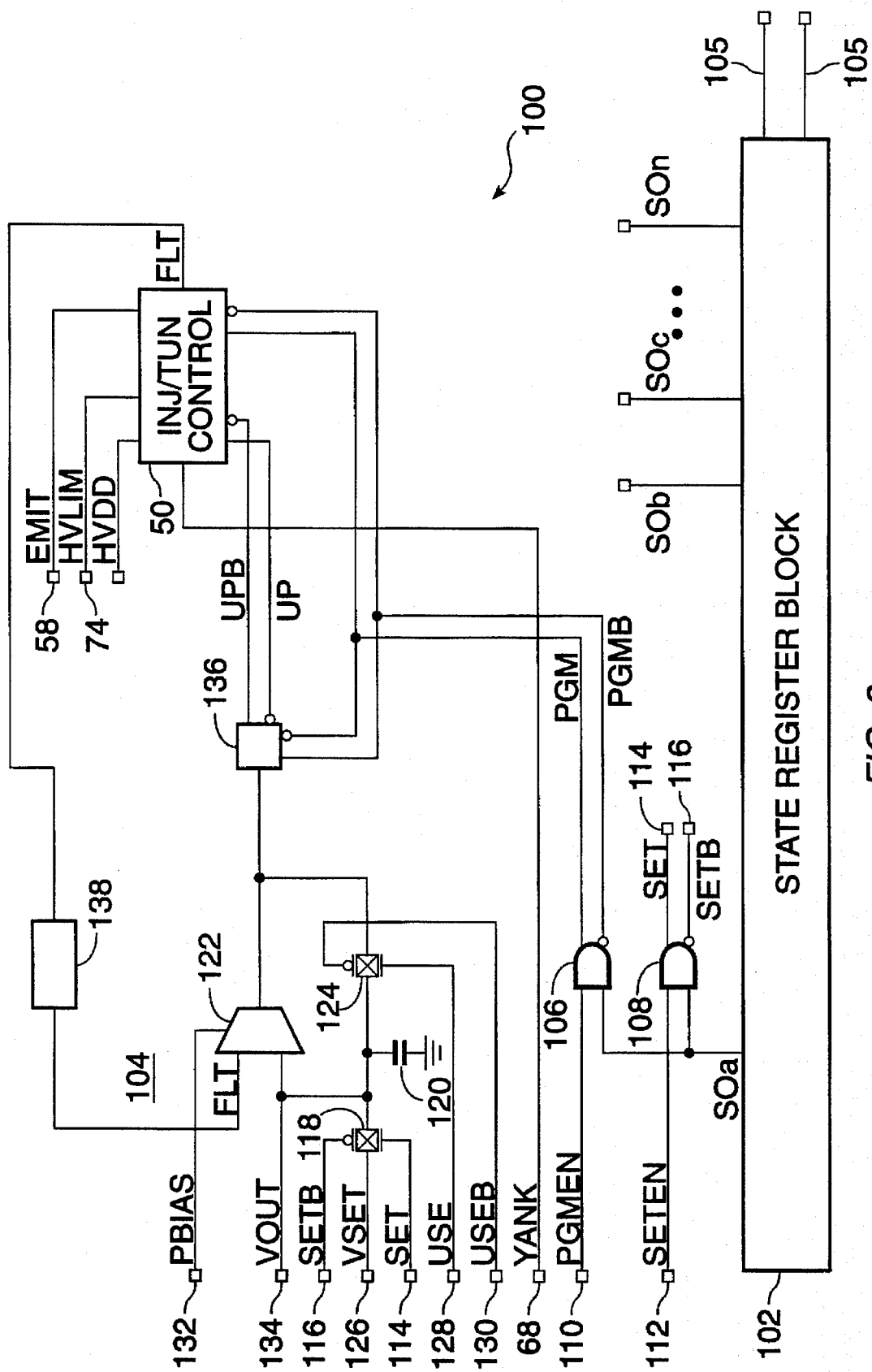
FIG. 3 is a combination block/schematic diagram of a circuit for providing a plurality of analog voltages which can be programmed simultaneously on an integrated circuit chip according to the present invention.

Referring now to FIG. 3, a circuit employing one or more injection and tunneling control circuits of FIG. 2 may be used to provide a plurality of analog voltages on an integrated circuit chip. The circuit 100 of FIG. 3 is shown as a combination block/schematic diagram. Circuit 100 includes a state register control block 102 having a plurality of outputs SOa, SOb, SOc, ... SOn, and further includes at least one analog voltage generating circuit 104 including an injection and tunneling control circuit 50, like that of FIG. 2.

State register block 102 is used to control the setting of the reference voltages in one or more injection and tunneling control circuits 50 (FIG. 2). Any digital control circuit which can provide control signals on the plurality of outputs SOa, SOb, SOc, ... SOn and which can provide the necessary timing control for other control signals as will be disclosed herein may be used to form state register block 102 and numerous different circuits capable of performing this function are known to those of ordinary skill in the art. Control of state register block 102 is made via one or more input lines 106. The number of input lines 105 will of course depend on the particular circuitry used to implement state register block 102 and skilled workers in the art will be readily able to implement this function.

Since each injection and tunneling control circuit 50 will be controlled by state register block 102 in the same manner, only one such circuit and its accompanying analog voltage generating circuit 104 is depicted in FIG. 3.

As may be easily seen from an examination of the signal path of output SOa of state register block 102 in FIG. 3, each output bit of the state register block 102 sends its output to a first input of two AND/NAND gates 106 and 108. Both AND/NAND gates 106 and 108 have complementary inverting and non-inverting outputs. The second input to AND/NAND gate 106 is driven from a program enable control node 110 (PGMEN) and the second input to AND/NAND gate 108 is driven from a set enable control node 112 (SETEN). The output of AND/NAND gate 106 creates the complementary control signals PGM and PGMB which were disclosed with reference to FIG. 2 and are used to control injection and tunneling control circuits 50. The output of AND/NAND gate 108 creates the complementary control signals SET and SETB (reference numerals 114 and 116). These signals are used to control a CMOS pass gate 118.

A voltage set capacitor 120, preferably having a capacitance of about 0.5 pf or greater, has a first plate connected to the output of pass gate 118, negative input of amplifier 122 (which may be a any of a number of ordinary CMOS transconductance amplifiers with P-channel MOS transistors as the bias transistor and differential pair transistors), and a second CMOS pass gate 124. Voltage set capacitor 120 has a second plate connected to ground. Voltage set capacitor 120 is used to dynamically store the target analog voltage for the analog voltage generating circuit 104, and those of ordinary skill in the art will recognize the combination of pass gate 118 and voltage set capacitor 120 as a simple sample/hold circuit. Pass gate 118 is driven from the analog voltage input bus 126 (VSET) and is controlled by the complementary SET and SETB control signals 114 and 116, respectively generated by AND/NAND gate 108 as described above. Pass gate 124 is driven from the output of amplifier 122 and is controlled by complementary normal-use control signals USE and USEB (reference numerals 128 and 130). A bias input of amplifier 122 is connected to bias node 132 (PBIAS). The voltage on PBIAS node 132 is used to create a bias current through amplifier 122, and a typical voltage found on that node will be about 3.8 volts.

Those of ordinary skill in the art will recognize that pass gates 118 and 124 may be used to configure amplifier 122 as either a comparator, used during voltage setting, or a follower amplifier, used during normal circuit operation. Pass gates 118 and 124 are never simultaneously enabled. When setting the voltage on floating gate 20, pass gate 118 is enabled and pass gate 124 is disabled, and the voltage on analog voltage input bus VSET 126 is stored on voltage set capacitor 120 to which the inverting input of amplifier 122 is connected. Since the non-inverting input of amplifier 122 is connected to floating gate 20, amplifier becomes a comparator, comparing the voltage on the floating gate 20 with the voltage on analog voltage input bus VSET 126. During normal operation of the circuit, pass gate 118 is disabled and pass gate 124 is enabled, and the inverting input of amplifier 122 is connected to its output, thus configuring it as a source follower amplifier, with the voltage on floating gate 20 as its input. The output voltage of the circuit is taken from node VOUT (reference numeral 134), connected to the inverting input of amplifier 122. During normal circuit operation, node VOUT 134 is also buffered by amplifier 122, since its output is connected to this node through pass gate 124.

The output of amplifier 122 also drives latch 136, which can be any one of a variety of standard CMOS restoring static latches, such as the one described in Circuit Design for CMOS VLSI, by John P. Uyemura, Kluwer Academic Publishers, 1992, p. 188. Latch 136 can be implemented in a variety of ways as is known by those skilled in the art. Latch 136 is controlled by complementary control signals PGM and PGMB generated from AND/NAND gate 106 as described above.

Latch 136 has both inverting and non-inverting outputs which provide the complementary UP and UPB inputs to the injection and tunneling control circuit 50. When control signal PGM is true and PGMB is false, the output UPB follows the state of its input. If the input is above some threshold level (typically 2.5 volts, the output of latch 136 is driven to 5 V. If the input is below that threshold level, the output of latch 134 is driven to 0 V. A complementary output of latch 136 is the node UP, which is always the complement of output node UPB. The complementary UP and UPB inputs to the injection and tunneling control circuit 50 are used to determine the direction in which the voltage on the floating gate 20 needs to be moved, i.e., which one of the injection or tunneling mechanisms needs to be activated.

The output of the injection and tunneling control circuit 50 is connected to the input X of some arbitrary subcircuit element 138 with output Y and having transfer function Y=f(X). The output Y of subcircuit element 138 is connected to the positive input of amplifier 122. The subcircuit element 138 transforms the output of injection and tunneling control circuit 50 so that the final voltage on the output of injection and tunneling control circuit 50 need not be the exact voltage stored on voltage set capacitor 120, but merely a voltage V such that when transformed by subcircuit element 138, it satisfies the condition that f(V) equals the voltage stored on voltage set capacitor 120.

In its simplest embodiment, subcircuit element 138 is merely a wire, so that f(X)=X. Then, node FLT settles to the desired voltage stored on capacitor 120. Another example of subcircuit element 138 which is useful in the present invention is a non-inverting analog adder as described in *Analog Filter Design* by M. E. Van Valkenburg, HRW Publishers, 1982, p. 37. The operation of a non-inverting analog adder is to output a voltage which is proportional to the sum of the input voltages. If a non-inverting analog adder is used as subcircuit element 138 and has one input connected to floating node FLT and another input connected to a constant voltage K, then f(X)=FLT+K. Since FLT+K will be compared to the desired voltage V stored on capacitor 120, node FLT will eventually settle to whatever voltage is necessary to create the desired voltage V on the output of subcircuit element 138 (V–K in this case, which is simple the inverse of the addition operation.

Another example of a circuit useful as subcircuit element 138 is an analog multiplier, such as the one described in *CMOS Analog Circuit Design* by Allen and Holberg, HGW Publishers, 1987, p. 599. The operation of an analog multiplier is to output a voltage which is proportional to the product of the inputs. If an analog multiplier is used as subcircuit element 138, and has as one input the floating node FLT and another input equal to some constant input K, then f(X)=K*FLT. Since K*FLT will be compared to the voltage V stored on capacitor 120, node FLT will eventually settle to whatever voltage is necessary to create the desired voltage V on the output of element 138 (in this case simply the inverse of the multiplication operation, or V/K). Other examples of subcircuit element 138 could be circuits with highly non-linear transfer functions, such that the inverse is not easily computable and therefore directly driving the inverse of the function onto capacitor 120 would be intractable.

Figure 4:
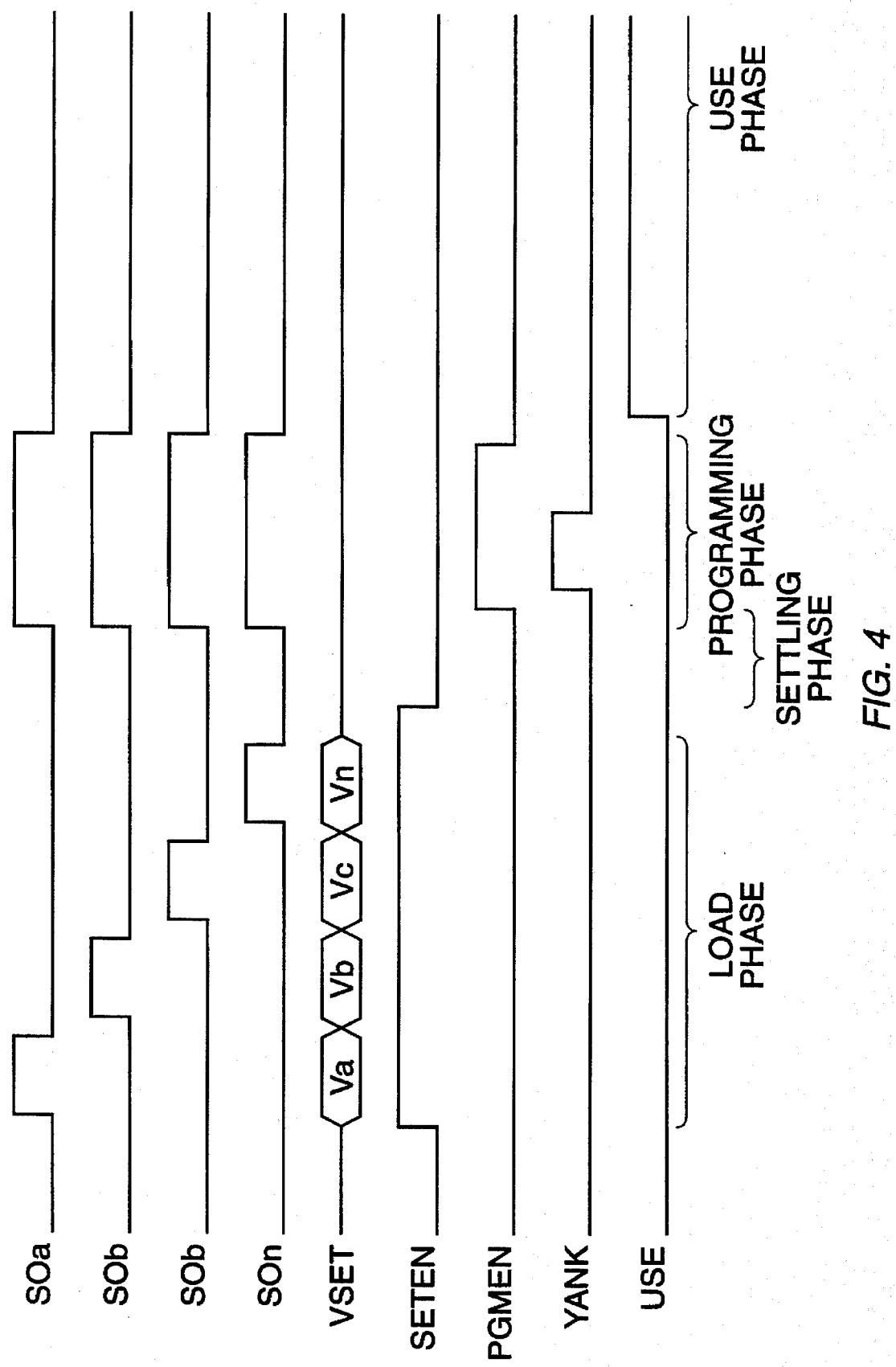
FIG. 4 is a timing diagram illustrating the operation of the circuit of FIG. 3.

The operation of the circuit 100 of FIG. 3 may be characterized by four different modes of operation. Referring now to FIG. 4, a timing diagram illustrates the operation of the circuit of FIG. 3 as just described. Basically, the mode of circuit operation is determined by the state of the pass gates 118 and 124, the control bits SOa ... SOn supplied by state register block 102, and the digital signal PGMEN 110.

During a first mode, referred to by the bracketed portion of the timing diagram denoted "LOAD PHASE", pass gate 118 is enabled by setting the SET control signal true, pass gate 124 is disabled by setting the USE control signal false, SOa is enabled, and the PGMEN control signal is set false, allowing the voltage on node VOUT to settle to the voltage on node VSET and charge voltage-set capacitor 120. As may be seen by an examination of FIG. 4, the voltage on node VSET is first set to Va, then the SOa signal is de-asserted and the SOb signal is asserted to charge a similar voltage set capacitor to Vb in another analog voltage generating circuit similar to circuit 104 in FIG. 3. Similarly, the SOc and SOn signals are in turn asserted to charge corresponding voltage set capacitors in other analog voltage generating circuits until all of the target voltages Va, Vb, Vc ... Vn have been captured by the voltage-set capacitors in each of their respective analog voltage generating circuits.

During a second mode, pass gate 118 is disabled by setting the SET control signal false, pass gate 124 is disabled by setting the USE control signal false, the state of control bit SOa is a don't care, and the PGMEN control signal is false. Typically this mode will immediately follow the first mode and is used to dynamically store the target voltage on VOUT node 134 on voltage-set capacitor 120 and to configure the amplifier 122 as a comparator between the voltage on floating gate 20 and the target voltage on VOUT. This mode is denoted by the bracket denoted "SETTLING PHASE" in FIG. 4.

During a third mode, pass gate 118 is disabled by setting the SET control signal false, pass gate 124 is disabled by setting the USE control signal false, SOa is enabled and the PGMEN control signal is true. This mode statically stores the analog voltage at the output of amplifier in latch 136 and allows the injection and tunneling control circuit 50 to either tunnel electrons from or inject electrons onto the floating gate 20, depending on the analog voltage on the output of latch 136. Note that node YANK 68 can be set true after the PGMEN control signal is true to put injection and tunneling control circuit 50 into a state more favorable for injection, but this is not strictly necessary. This mode is denoted by the bracket denoted "PROGRAMMING PHASE" in FIG. 4.

In a fourth mode, pass gate 118 is disabled by setting the SET control signal false, pass gate 124 is enabled by setting the USE control signal true, and SOa is disabled. With pass gate 124 enabled, amplifier 122 is configured as a source follower and the analog voltage stored on floating gate 20 is buffered and appears on VOUT node 134. This is the mode for normal circuit use and is denoted by the bracket denoted "USE PHASE" in FIG. 4.

In summary, the sequence of events which occurs to write a voltage onto floating gate 20 when used to create a plurality of analog voltages on an integrated circuit may be summarized as follows. First, the target voltage is sampled on voltage-set capacitor 120. Next, the amplifier 122 is placed into a comparator configuration by setting the control signal USE false. The output of the output of the comparator is latched by setting the control signal PGMEN true so that injection and tunneling control circuit 50 will either have UP or UPB true based on the output of comparator. The control signal YANK is asserted to capacitively couple the floating gate into a state favorable for injection. A suitable amount of time (typically 150 us) is then allowed to elapse so that either tunneling or injection can occur, and then the control signal YANK is set false. The control signal PGMEN is set false and the target voltage is allowed to settle. This basic algorithm can be modified an a variety of ways obvious to those skilled in the art.

In all of the modes of the circuit of FIG. 3 disclosed herein, any number of state bits SOa, SOb, SOc ... SOn may be enabled, thus allowing fully parallel programming of all floating gate devices in the circuit. Those of ordinary skill in the art will recognize that, for greatest flexibility of operation, only one bit of the state register will be active during the first and second operating modes so that different voltages can be sampled and held on the capacitor 120 in the different analog voltage generating circuits 104 in the circuit, while all bits of the state register will be active during the third and fourth operating modes of the circuit so that injection/tunneling steps to set the voltage and normal operation can occur in parallel for all analog voltage generating circuits 104 in the circuit.

Those of ordinary skill in the art will note that the feedback connection from the output of injection and tunneling control circuit 50 to the non-inverting input of amplifier 122 need not be direct, but may be derived from the action of the output of injection and tunneling control circuit 50 on some other circuitry which has direct connection to the non-inverting input of amplifier 122. Thus, the floating gate 20 need not be programmed to the same voltage as the target stored on capacitor 120, but merely a voltage that satisfies the condition that the two final voltages on the inverting and non-inverting inputs of amplifier 122 be approximately equal.

A plurality of analog voltage generating circuits are likely to be disposed in a typical integrated circuit incorporating the present invention. The EMIT, HVLIM, and HVDD circuit nodes are preferably common to each injection and tunneling control circuit 50 and would usually be brought to input/output pins of the integrated circuit. A clock pin and a set/reset pin for controlling the state register block 102 would also normally be provided on the integrated circuit containing the present invention. The only other input/output pins required on the integrated circuit for the functioning of the present invention are the pins necessary to address select all digital control block outputs SOa, SOb, SOc, ... SOn, and the digital control lines PGMEN, SETEN, USE, and USEB (reference numerals 110, 112, 128, and 130), which are also preferably common to each analog voltage generating circuit 104.

According to another aspect of the present invention, a floating gate storage circuit can be used to generate a plurality of P-channel and N-channel MOS transistor bias signals. This arrangement may be best understood with reference to FIG. 5.

Figure 5:
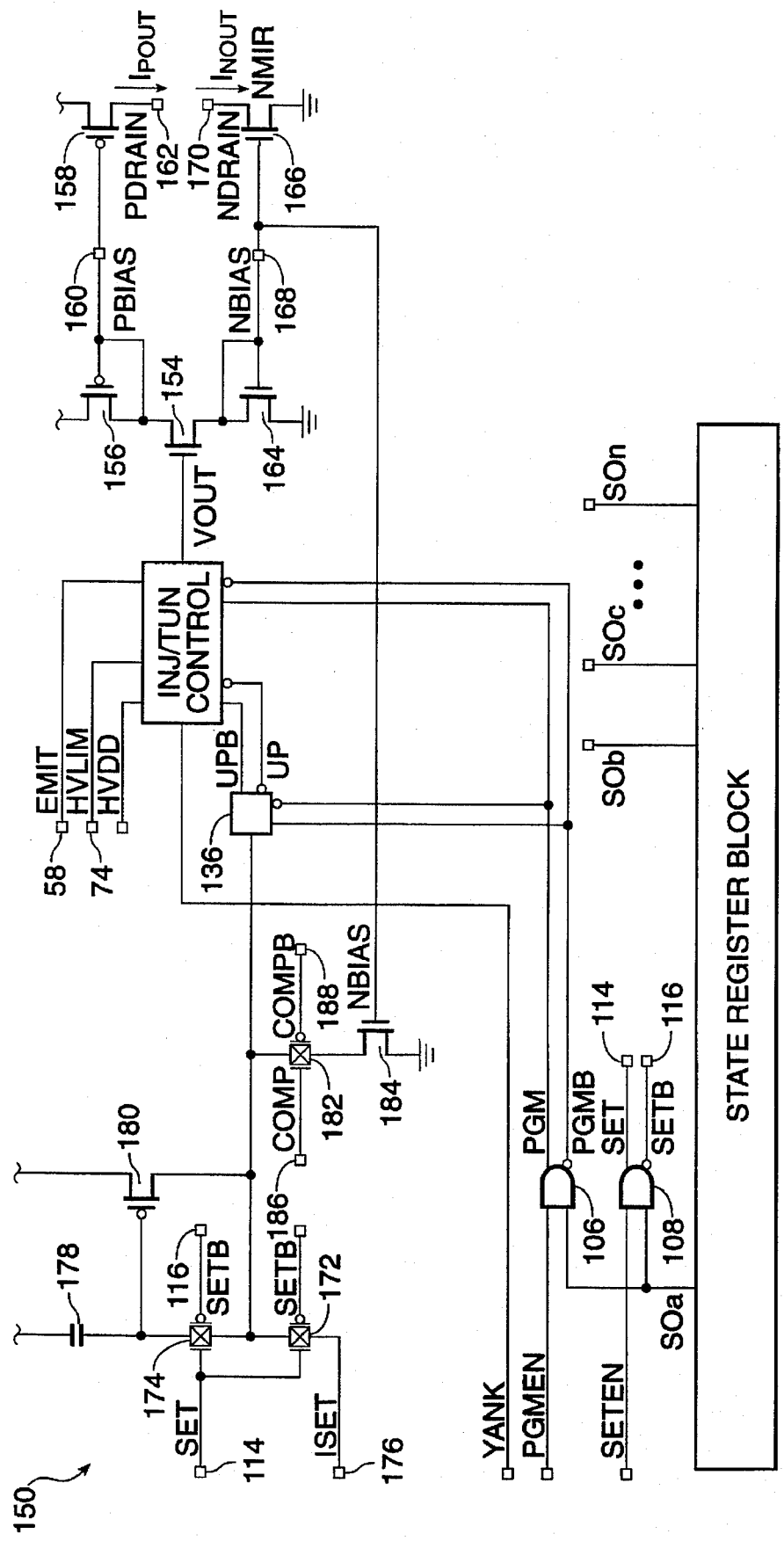
FIG. 5 is a combination block/schematic diagram of a circuit for providing a plurality of analog currents which can be programmed simultaneously on an integrated circuit chip according to the present invention.

Referring now to FIG. 5, the injection and tunneling control circuit 50 described in FIG. 2 may be used to provide a plurality of analog current biases of both P-channel and N-channel types on an integrated circuit. The bias current generating circuit 150 of FIG. 5 is shown as a combination block/schematic diagram. The circuit of FIG. 4 is similar to the circuit of FIG. 3 in that it includes a state register block 102, which may be identical to its counterpart in FIG. 3, and a injection and tunneling control circuit 50 which also may be identical to the one disclosed in FIG. 2.

As in the circuit of FIG. 3, each output bit SOa, SOb, SOc, ... SOn of the state register block 102 sends its output to a first input of two AND gates 106 and 108 which have both inverting and non-inverting outputs. The second input to AND gate 106 is driven from circuit node PGMEN and the second input to AND gate 108 is driven from circuit node SETEN. The output of AND gate 106 creates the complementary control signals PGM and PGMB used to control the injection and tunneling control circuit 50. The output of AND gate 108 creates the complementary control signals SET and SETB 114, and 116, respectively.

Unlike the circuit of FIG. 3, the floating gate of the circuit of FIG. 5 is connected to the gate of an N-channel MOS transistor 154. The drain of N-channel MOS transistor 154 is connected to the drain and gate of P-channel MOS current-mirror transistor 156 and to the gate of P-channel MOS current-mirror transistor 158, which together form a PBIAS node 160. The sources of P-Channel MOS transistors 156 and 158 are connected to VDD. The drain of P-channel MOS transistor 156 forms the P-channel transistor current reference output (IPOUT) node 162.

The source of N-channel MOS transistor 154 is connected to the drain and gate of N-channel MOS current-mirror transistor 164 and to the gate of N-Channel MOS current-mirror transistor 166, which together form an NBIAS node 168. The sources of N-channel bias transistors 164 and 166 are connected to ground. The drain of N-Channel MOS transistor 166 forms the N-channel transistor current reference output (INOUT) node 170.

Those of ordinary skill in the art will recognize that a P-Channel MOS transistor could be used in place of N-channel MOS transistor 154. If a P-channel MOS transistor is used, such skilled persons will realize that transistor 64 of FIG. 2 must also be a P-channel MOS transistor, having its gate connected to PGM and its source connected to the first power supply rail VDD. These changes to injection and tunneling control circuit 50 must be made so that capacitor 60 in FIG. 2 is referenced to the appropriate voltage rail during normal operation.

Complementary control signals SET and SETB control a pair of pass gates 172 and 174 connected in series between a current set node (ISET) 176 and the first plate of a capacitor 178. The second plate of the capacitor 178 is connected to a fixed voltage such as VDD. Capacitor 178 preferably has a capacitance of about 0.5 pf or greater.

The first plate of capacitor 178 is also connected to the gate of P-channel MOS transistor 180. The source of P-channel MOS transistor 180 is connected to VDD. Capacitor 178 is used to dynamically store the target analog gate voltage for P-channel MOS transistor 180 to use to create the target current bias. Pass gate 174 is controlled by signals SET and SETB generated by AND/NAND gate 108 described above and has as its input the drain of transistor 180 so that when pass gate 174 is active, P-channel MOS transistor 180 will be in a diode configuration.

The drain of P-channel MOS transistor 180 is also connected to the output of pass gate 182. Pass gate 182 is driven from the drain of N-channel MOS transistor 184, having its gate connected to control node NBIAS 168 and its source connected to ground. Pass gate 182 is controlled by complementary control nodes COMP 186 and COMPB 188.

The drain of P-channel MOS transistor 180 also drives latch 136. Latch 136 can be implemented in a variety of ways in the same manner as its counterpart latch 136 in the circuit of FIG. 3 as is known by those skilled in the art. Latch 136 is controlled by the complementary control signals PGM and PGMB generated from AND gate 106 describe above. Latch 136 has both inverting and non-inverting outputs which drive the UP and UPB inputs to the injection and tunneling control circuit 50.

As in the circuit of FIG. 3, in an integrated circuit including a plurality of P-channel and N-channel MOS transistor bias generating circuits, the EMIT, HVLIM, and HVDD circuit nodes are preferably common to each bias generating circuit and are brought to input/output pins of the integrated circuit. A clock pin and a set/reset pin for the state register block 102 are also provided on the integrated circuit. The only other input/output pins required on the integrated circuit are the pins necessary to address select all state register block 102 outputs SOa . . . SOn, and the digital control lines PGMEN, SETEN, COMP, and COMPB. The digital control lines PGMEN, SETEN, COMP, and COMPB are preferably common to each bias generating circuit.

The operation of the circuit of FIG. 5 is substantially the same at the operation of the circuit of FIG. 3. The states of pass gates 172, 174, and 182, the control bit SOa, and the control signal PGMEN determine the operating mode. During a first operating mode, pass gates 172 and 174 are enabled by setting SET control signal true, pass gate 182 is disabled by setting the COMP control signal false, SOa is enabled, and the PGMEN control signal is set false, allowing the voltage on the gate of transistor 180 to settle to the voltage necessary to source the target current flowing into or out of current set node ISET 176.

During a second operating mode, pass gates 172 and 174 are disabled by setting SET control signal false, pass gate 182 is enabled by setting the COMP control signal true, the state of control bit SOa is a don't care, and PGMEN control signal is set false. Typically this mode will immediately follow the first mode and is used to dynamically store the gate voltage for the target current on capacitor 178 and configure the transistor 180 as a comparator between the stored target current and the current being created by the floating gate voltage on the bias current generating output transistors 154, 156, and 164.

During a third operating mode, pass gates 172, 174, and 182 are disabled by setting SET and COMP control signals false, SOa is enabled and PGMEN is true. This operating mode statically stores the output of the current comparator in latch 136 and allows the floating gate device to either tunnel or inject, dependent on the output of latch 136. Note that control node YANK can be set true after PGMEN is true to put injection and tunneling control circuit 50 into a state more favorable for injection, but this is not strictly necessary.

During a fourth operating mode, pass gates 172, 174, and 182 are disabled by setting SET and COMP control signals false, and SOa is disabled. With pass gate 182 disabled, there is no current flowing from the drain to the source of N-Channel MOS transistor 184. This fourth operating mode is the mode for normal circuit use and employs the bias current created in the output transistors 154, 156, and 164 by the voltage on floating node VOUT. An output current of either direction (current IPOUT or INOUT) is created by employing transistors 156, 158, 164, and 166 as standard current mirrors, as is apparent to those of ordinary skill in the art from an examination of FIG. 4. The second operating mode can be used equally well as the operational mode if the waste of power by having current flow through NMOS transistor 184 can be ignored. VOUT creates the desired current. This is the mode for normal circuit use, although the second mode can be used equally well if the current through MOS transistor 184 does not load the circuitry using the bias current created in the output devices by the voltage on floating gate 20.

In all of these operating modes, any number of state bits SOa..SOn may be enabled, thus allowing fully parallel programming of all floating gate devices in the circuit. It should be noted that in typical operation, only one bit of the state register block 102 will be active so that different gate voltages can be sampled and held on each of the capacitors in the circuit, while all bits of the state register block 102 will be active during the third and fourth modes so that injection/tunneling and normal operation can occur in parallel.

In summary, the sequence of events which occurs to write a voltage onto floating gate 20 when used to create a plurality of analog p- and n- device bias currents on an integrated circuit may be summarized as follows. First, the target current is sampled by sampling the voltage on capacitor 178 created when forcing the target current through a diode connected transistor 180. Next, the transistor 180 is placed into a comparator configuration by setting SET control signal false and a current is generated by the floating gate voltage by N-Channel MOS transistor 154 and the current mirror formed by N-Channel MOS transistors 164 and 184 through transistor 180 by setting the COMP control signal true. The output of the comparator is then latched by setting the PGMEN control signal true so that either the UP or UPB output from latch 136 in injection and tunneling control circuit 50 will be true based on the output of comparator. Control signal YANK is then set true to capacitively couple the floating gate into a state favorable for injection. After a wait period of a suitable amount of time (typically 150 us) is allowed to elapse so that either tunneling or injection can occur, the control signal YANK is set false and the control signal PGMEN is set false, and the target current is then reached. This basic algorithm can also be modified an a variety of ways obvious to those skilled in the art.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A circuit disposed on a semiconductor substrate for generating N analog voltage signals in a semiconductor integrated circuit disposed on said semiconductor substrate, including:

N analog floating gate storage devices disposed on said semiconductor substrate, each of said analog floating gate storage devices including a floating gate;

a non-avalanche hot electron injection means associated with each of said analog floating gate device for injecting electrons onto its floating gate;

digital control means for selectively activating each electron injection means;

means associated with each of said analog floating gate devices for removing electrons from its floating gate;

an analog output voltage bus associated with each of said analog floating gate devices, each of said analog output voltage busses having a capacitance associated therewith; and a high input impedance follower amplifier associated with each of said analog floating gate devices, each of said follower amplifiers having an input connected to its floating gate and an output connected to its analog output voltage bus.

2. The circuit of claim 1 wherein said means for removing electrons from said floating gates includes means for illuminating said floating gates with ultraviolet radiation.

3. The circuit of claim 1 wherein said means for removing electrons from said floating gates comprises means for tunneling electrons from said floating gates.

4. The circuit of claim 1, further including:

a monitor/dynamic load line;

an analog pass gate connected between each one of said analog output voltage buses and said monitor/dynamic load line; and means for providing a separate strobe signal to each of said analog pass gates.

5. A circuit disposed on a semiconductor substrate for generating an analog voltage signal in a semiconductor integrated circuit disposed on said semiconductor substrate, including:

an analog floating gate storage device disposed on said semiconductor substrate, said analog floating gate storage device including a floating gate connected to a stabilizing capacitor, and a non-avalanche hot electron injection device including a collector connected to a first voltage node, an emitter connected to a second voltage node and a base connected to a third voltage node;

means for removing electrons from said floating gate;

an analog output voltage bus; and a high input impedance follower amplifier having an input connected to said floating gate and an output connected to said analog output voltage bus.

6. The circuit of claim 5 wherein said means for removing electrons from said floating gate includes means for illuminating said floating gate with ultraviolet radiation.

7. The circuit of claim 5 wherein said means for removing electrons from said floating gate comprises means for tunneling electrons from said floating gate.

8. The circuit of claim 5 wherein said analog output voltage bus has a capacitance associated therewith, said capacitance having a value greater than the inherent capacitance associated with said bus and further including means for turning off the output of said follower amplifier.

9. The circuit of claim 8, further including:

a monitor/dynamic load line;

an analog pass gate connected between said analog output voltage bus and said monitor/dynamic load line; and means for providing a strobe signal to said analog pass gate.

10. A circuit disposed on a semiconductor substrate for generating N analog voltage signals in a semiconductor integrated circuit disposed on said semiconductor substrate, including:

N analog floating gate storage devices disposed on said semiconductor substrate, each of said analog floating gate storage devices including:

a select node, a first P-channel MOS transistor, having a source connected to a first voltage source, a drain, and a gate connected to said select node, a second P-channel MOS transistor, having a source connected to a second voltage source, a drain, and a gate connected to said select node, a floating gate connected to a stabilizing capacitor, a non-avalanche hot electron injection device including a collector connected to the drain of said first P-channel MOS transistor, a base connected to the drain of said second P-channel MOS transistor, an emitter connected to a third voltage node, and an insulated gate disposed above said base, said insulated gate self aligned with said collector and not overlapping said emitter, said insulated gate connected to said floating gate, means for removing electrons from said floating gate, and wherein said first, second, and third voltage sources are selected so as to cause non-avalanche hot electron injection onto said floating gate;

addressing means for activating selected ones of said select nodes so as to turn on their first and second P-channel MOS transistors:

an analog output voltage bus; and a high input impedance follower amplifier having an input connected to said floating gate and an output connected to said analog output voltage bus.

11. The circuit of claim 10 wherein said means for removing electrons from said floating gates includes means for illuminating said floating gates with ultraviolet radiation.

12. The circuit of claim 10 wherein said means for removing electrons from said floating gates comprises means for tunneling electrons from said floating gates.

13. The circuit of claim 10 wherein said analog output voltage bus has a capacitance associated therewith, said capacitance having a value greater than the inherent capacitance associated with said bus and further including means for turning off the output of said follower amplifier.

14. The circuit of claim 13, further including:

a monitor/dynamic load line;

an analog pass gate connected between said analog output voltage bus and said monitor/dynamic load line; and means for providing a strobe signal to said analog pass gate.

15. The circuit of claim 14, further including a diode-connected N-channel MOS transistor having a source connected to a second voltage rail, and a drain connected to the source of said MOS transistor, said diode connected N-channel MOS transistor having a capacitor connected between its gate and source.

16. The circuit of claim 15, wherein said MOS transistor is an N-channel MOS transistor.

* * * * *

UNITED STATES PATENT AND TRADEMARK OFFICE
CERTIFICATE OF CORRECTION

PATENT NO. : 5,629,891
DATED : May 13, 1997
INVENTOR(S) : John Le Moncheck, Timothy P. Allen, Günter Steinbach Page 1 of 2

It is certified that error appears in the above-indentified patent and that said Letters Patent is hereby corrected as shown below:

Column 2, line 44: replace "log$_2$(N)" with --log$_2$(N)--.

Column 3, lines 59-62: replace "second polysilicon layer 32 includes a portion 34 which overlies a large portion of floating gate 20. Portion 34 of the second polysilicon layer is separated from floating gate 20 by a layer of interpoly oxide 36 as is known in the art and is thus capacitively coupled to floating gate 20. Portion 34 of the second polysilicon layer" with --second polysilicon layer 34 includes a portion 36 which overlies a large portion of floating gate 20. Portion 36 of the second polysilicon layer is separated from floating gate 20 by a layer of interpoly oxide 38 as is known in the art and is thus capacitively coupled to floating gate 20. Portion 36 of the second polysilicon layer--.

Column 4, lines 1-5: replace "a small portion 38 of floating gate 20 overlies a region of n-type material 40 separated by a layer of insulating material 42, such as gate oxide. The region of n-type material 40 lies in an n-well 44 and together they form the on node of a tunneling device 22. When the n-well 44 is biased" with --a small portion 40 of floating gate 20 overlies a region of n-type material 42 separated by a layer of insulating material 44, such as gate oxide. The region of n-type material 42 lies in an n-well 46 and together they form the on node of a tunneling device 22. When the n-well 46 is biased--.

Column 5, line 3: replace "72" with --70--.

Column 5, line 43: replace "72" with --70--.

Column 5, lines 46-47: replace "90 and 92" with --92 and 94--.

Column 5, line 50: replace "90 and 92" with --92 and 94--.

Column 6, lines 38-39: replace "90 and 92" with --92 and 94--.

Column 6, line 45: replace "90 and 92" with --92 and 94--.

UNITED STATES PATENT AND TRADEMARK OFFICE
CERTIFICATE OF CORRECTION

PATENT NO. : 5,629,891

DATED : May 13, 1997

INVENTOR(S) : John Le Moncheck, Timothy P. Allen, Günter Steinbach

It is certified that error appears in the above-indentified patent and that said Letters Patent is hereby corrected as shown below:

Column 7, line 40: replace "106" with --105--.

Column 8, line 2: replace "(which may be a any of a number" with --(which may be any of a number--.

Column 8, line 61: replace "134" with --136--.

Column 9, line 28: replace "simple" with --simply--.

Column 10, line 14: replace "SETFLING" with --SETTLING--.

Column 10, line 53: replace "an" with --in--.

Column 11, line 41: replace "FIG. 4" with --FIG. 5--.

Column 11, line 65: replace "156" with --158--.

Column 12, line 46: replace "describe" with --described--.

Column 13, line 40: replace "FIG. 4" with --FIG. 5--.

Column 14, line 16: replace "an" with --in--.

Claim 10, Column 15, line 41: replace: "to said a" with --to a--.

Signed and Sealed this

Twenty-first Day of October 1997

Attest:

BRUCE LEHMAN

*Attesting Officer*     *Commissioner of Patents and Trademarks*